US012002666B2

(12) United States Patent
Sawachi et al.

(10) Patent No.: US 12,002,666 B2
(45) Date of Patent: Jun. 4, 2024

(54) MEASURING DEVICE, MEASURING METHOD, AND VACUUM PROCESSING APPARATUS

(71) Applicant: TOKYO ELECTRON LIMITED, Tokyo (JP)

(72) Inventors: Atsushi Sawachi, Miyagi (JP); Ichiro Sone, Miyagi (JP); Takuya Nishijima, Miyagi (JP); Suguru Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 683 days.

(21) Appl. No.: 17/113,031

(22) Filed: Dec. 5, 2020

(65) Prior Publication Data

US 2021/0175055 A1 Jun. 10, 2021

(30) Foreign Application Priority Data

Dec. 6, 2019 (JP) .................................. 2019-221379

(51) Int. Cl.
*H01J 37/32* (2006.01)
*G01J 3/443* (2006.01)

(52) U.S. Cl.
CPC ......... *H01J 37/32972* (2013.01); *G01J 3/443* (2013.01); *H01J 37/32733* (2013.01)

(58) Field of Classification Search
CPC ........... H01J 37/32972; H01J 37/32733; G01J 3/443; G01J 3/0205
See application file for complete search history.

(56) References Cited

U.S. PATENT DOCUMENTS

2005/0269334 A1* 12/2005 Bang ...................... E05F 15/56
220/581
2006/0157698 A1* 7/2006 Miyajima ......... H01L 21/67288
257/48

FOREIGN PATENT DOCUMENTS

| JP | 2003-179120 A | | 6/2003 |
|---|---|---|---|
| JP | 2003179120 A | * | 6/2003 |
| JP | 2005-246350 A | | 9/2005 |
| JP | 2006-196716 A | | 7/2006 |
| JP | 2018-107264 A | | 7/2018 |

\* cited by examiner

*Primary Examiner* — Yuechuan Yu
(74) *Attorney, Agent, or Firm* — XSENSUS LLP

(57) ABSTRACT

A measuring device for a vacuum processing apparatus including a processing chamber having a first gate for loading and unloading a substrate and a second gate different from the first gate is provided. The measuring device includes a case having art opening that is sized to correspond to the second gate of the processing chamber and is airtightly attachable to the second gate, a decompressing mechanism configured to reduce a pressure in the case, and a measuring mechanism accommodated in the case and configured to measure a state in the processing chamber through the opening in a state where the pressure in the case is reduced by the decompressing mechanism.

10 Claims, 12 Drawing Sheets

MEASURING DEVICE, MEASURING METHOD, AND VACUUM PROCESSING APPARATUS

CROSS-REFERENCE TO RELATED APPLICATIONS

This application claims priority to Japanese Patent Application No. 2019-221379, filed on Dec. 6, 2019, the entire contents of which are incorporated herein by reference.

TECHNICAL FIELD

The present disclosure relates to a measuring device, a measuring method, and a vacuum processing apparatus.

BACKGROUND

Conventionally, there is known a vacuum processing apparatus for performing various treatments for processing a substrate such as a semiconductor wafer (hereinafter, referred to as "wafer") disposed in a processing chamber maintained in a vacuum state. In the vacuum processing apparatus, it is important to measure a state in the processing chamber, such as an emission intensity of plasma, because the state in the processing chamber affects the characteristics of the substrate after the processing.

Therefore, there is suggested a technique measuring the emission intensity of plasma in the processing chamber from the outside of the processing chamber using an optical emission spectrometer (OES) disposed on a sidewall of the processing chamber through a quartz window (see, e.g., Japanese Patent Application Publication No. 2018-107264).

SUMMARY

The present disclosure provides a technique capable of measuring the state in the processing chamber with high accuracy without opening the processing chamber to the atmosphere.

In accordance with an aspect of the present disclosure, there is provided a measuring device for a vacuum processing apparatus including a processing chamber having a first gate for loading and unloading a substrate and a second gate different from the first gate, the measuring device including: a case having an opening that is sized to correspond to the second gate of the processing chamber and is airtightly attachable to the second gate; a decompressing mechanism configured to reduce a pressure in the case; and a measuring mechanism accommodated in the case and configured to measure a state in the processing chamber through the opening in a state where the pressure in the case is reduced by the decompressing mechanism.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
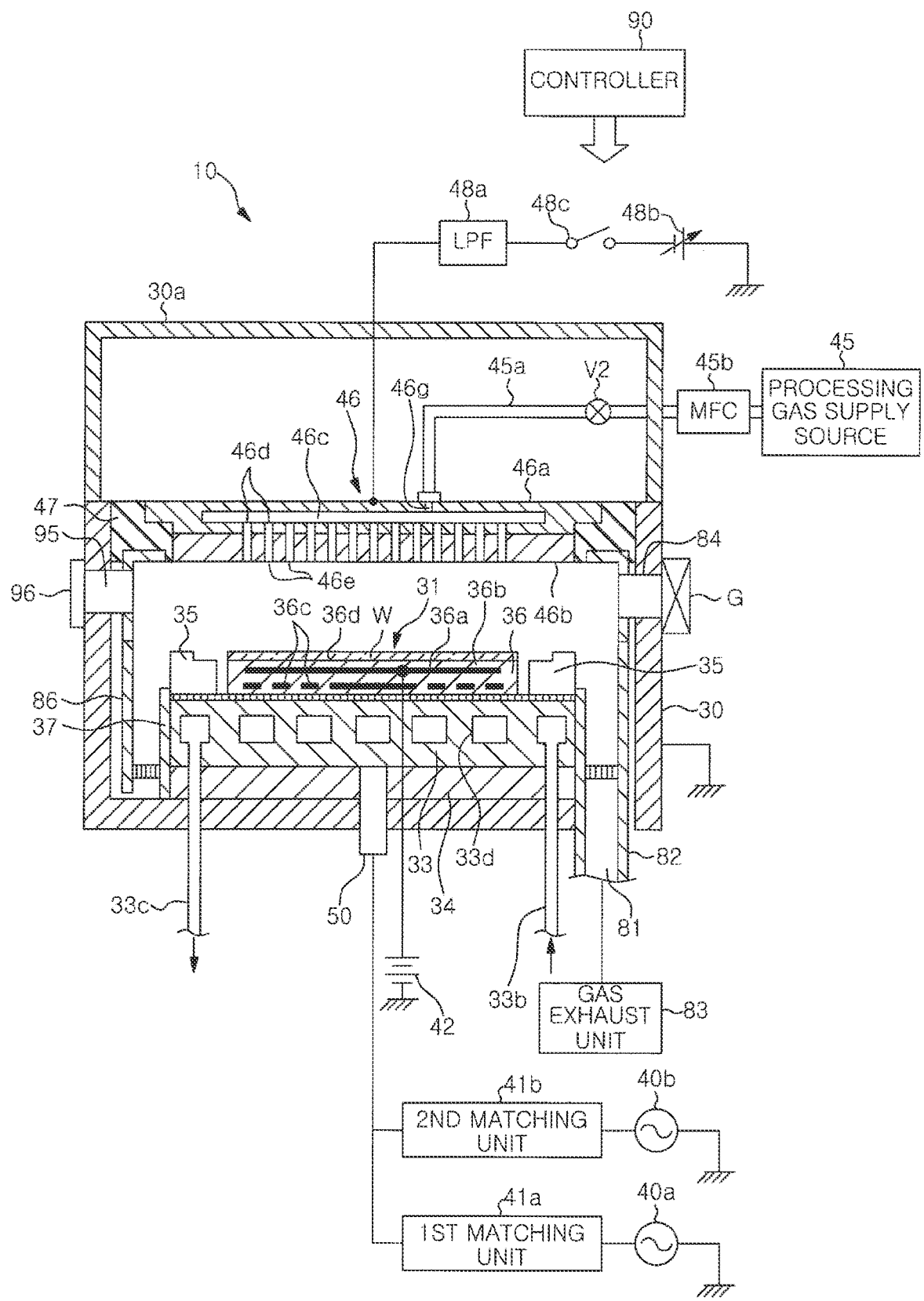
FIG. 1 schematically shows a plasma etching apparatus according to an embodiment.

Hereinafter, embodiments will be described in detail with reference to the accompanying drawings. Like reference numerals will be given to like or corresponding parts throughout the drawings.

In the case of measuring a state in a processing chamber from the outside of the processing chamber using a measuring device such as an optical emission spectrometer (OES), the measuring device is distant from a substrate disposed in the processing chamber and, thus, the measurement accuracy near the substrate is diminished.

Therefore, in a vacuum processing apparatus, it is considered to open the processing chamber to the atmosphere and dispose the measuring device such as an OES near the substrate to directly measure the state in the processing chamber. However, in the vacuum processing apparatus, once the processing chamber is opened to the atmosphere, a considerable amount of time is required to restart the substrate processing due to a control such as temperature adjustment or moisture control in the processing chamber. As a result, the productivity is lowered.

In addition, it is considered to measure the state in the processing chamber without opening the processing chamber to the atmosphere by providing the measuring device such as an OES at a transfer system such as a transfer arm for transferring a substrate to a vacuum, processing apparatus maintained in the vacuum state and transferring the measuring device into the processing chamber using the transfer system. Since, however, the measuring device is heavier than the substrate, the transfer system having a strength that can withstand the weight of the measuring device is required in the case of transferring the measuring device using the transfer system. Therefore, it is not practical to transfer the measuring device using the transfer system.

Hence, it is desired to measure the state in the processing chamber with high accuracy without opening the processing chamber to the atmosphere.

Configuration of the Measurement Target Device

Hereinafter, a measurement target device to be measured by the measuring device will be described. The measurement target device is a vacuum processing apparatus for performing predetermined substrate processing on a substrate such as a wafer disposed in a processing chamber maintained in a vacuum state. In the present embodiment, a case where the measurement target device is a plasma etching apparatus for performing plasma etching on the substrate will be described as an example.

FIG. 1 schematically shows a plasma etching apparatus according to an embodiment. A plasma etching apparatus 10 includes an airtight processing chamber 30 that is electrically grounded. The processing chamber 30 has a cylindrical shape and is made of, e.g., aluminum having an anodically oxidized surface. The processing chamber 30 defines a processing space in which plasma is generated. A substrate support 31 for horizontally supporting the wafer W is disposed in the processing chamber 30.

The substrate support 31 has a substantially cylindrical shape with an upper surface and a bottom surface oriented in a vertical direction. The upper surface of the substrate support 31 serves as a substrate supporting surface 36d. The substrate supporting surface 36d of the substrate support 31 is greater in size than the wafer W. The substrate support includes a base 33 and an electrostatic chuck 36.

The base 33 is made of a conductive metal such as aluminum. The base 33 serves as a lower electrode. The base 33 is supported by an insulating support 34 disposed at a bottom portion of the processing chamber 30.

The electrostatic chuck 36 has a flat disc-shaped upper surface. The upper surface serves as the substrate supporting surface 36d on which the wafer W is placed. The electrostatic chuck 36 is disposed at the center of the substrate support 31 in plan view. The electrostatic chuck 36 has an electrode 36a and an insulator 36b. The electrode 36a is embedded in the insulator 36b. A DC power supply 42 is connected to the electrode 36a. The electrostatic chuck 36 is configured to attract and hold the wafer W by a Coulomb force generated by applying a DC voltage from the DC power supply 42 to the electrode 36a. Further, a heater 36c is disposed in the insulator 36b of the electrostatic chuck 36. The heater 36c controls the temperature of the wafer W by a power supplied through a power supply mechanism to be described later.

A focus ring 35 made of, e.g., single crystalline silicon, is disposed on an outer peripheral portion of the substrate support 31. Further, a cylindrical inner wall member 37 made of, e.g., quartz, is disposed to surround the substrate support 31 and the support 34.

A power feed rod 50 is connected to the base 33. A first radio frequency (RF) power supply 40a is connected to the power feed rod 50 through a first matching unit 41a, and a second RF power supply 40b is connected to the power feed rod 50 through a second matching unit 41b. The first RF power supply 40a is a power supply for plasma generation. An RF power having a predetermined frequency is supplied from the first RF power supply 40a to the base 33 of the substrate support 31. Further, the second RF power supply 40b is a power supply for ion attraction (for bias). An RF power having a predetermined frequency lower than that of the first RF power supply 40a is supplied from the second RF power supply to the base 33 of the substrate support 31.

A coolant channel 33d is formed in the base 33. The coolant channel 33d has one end connected to a coolant inlet line 33b and the other end connected to a coolant outlet line 33c. The plasma etching apparatus 10 is configured to control the temperature of the substrate support 31 by supplying and circulating a coolant such as cooling water through the coolant channel. 33d. Further, the plasma etching apparatus 10 may have a configuration in which the temperature of the wafer W and the temperature of the focus ring 35 can be individually controlled by separately providing coolant channels in the areas of the base 33 that correspond to the areas where the wafer W and the focus ring 35 are placed. Moreover, the plasma etching apparatus 10 may have a configuration in which the temperature of the wafer W and the temperature of the focus ring 35 can be individually controlled by supplying a cold heat transfer gas to a backside of the wafer W or to a bottom surface of the focus ring 35. For example, a gas supply line for supplying the cold heat transfer gas (backside gas) such as helium gas to the backside of the wafer W may be formed through the substrate support 31. The gas supply line is connected to a pas supply source. With this configuration, the wafer W attracted and held by the electrostatic chuck 36 on the upper surface of the substrate support 31 is controlled to a predetermined temperature.

A shower head 46 serving as an upper electrode is disposed above the substrate support 31 to face the substrate support 31 in parallel therewith. The shower head 46 and the substrate support 31 function as a pair of electrodes (upper electrode and lower electrode).

The shower head 46 is disposed at a ceiling wall portion of the processing chamber 30. The shower head 46 includes a main body 46a and an upper ceiling plate 46b serving as an electrode plate. The shower head 46 is supported at an upper portion of the processing chamber 30 through an insulating member 47. The main body 46a is made of a conductive material, e.g., aluminum having an anodically oxidized surface. The upper ceiling plate 46b is detachably held at a bottom surface of the main body 46a.

A gas diffusion space 46c is formed in the main body 46a. A plurality of gas holes 46d is formed in a bottom portion of the main body 46a to be positioned under the gas diffusion space 46c. Gas injection holes 46e are formed through the upper ceiling plate 46b in a thickness direction thereof to communicate with the gas holes 46d, respectively. With such a configuration, a processing gas supplied to the gas diffusion space 46c is diffused and supplied in a shower-like manner into the processing chamber 30 through the gas holes 46d and the gas injection holes 46e.

A gas inlet port 46g for introducing the processing gas into the gas diffusion space 46c is formed in the main body 46a. One end of a gas supply line 45a is connected to the gas inlet port 46g. The other end of the gas supply line 45a is connected to a processing gas supply source 45 for supplying the processing gas. A mass flow controller (MFC) 45b and an opening/closing valve V2 are disposed in the gas supply line 45a, in that order, from an upstream side. The processing gas for plasma etching is supplied from the processing gas supply source 45 to the gas diffusion space 46c through the gas supply line 45a, and then is diffused and supplied in a shower-like manner into the processing chamber 30 through the gas holes 46d and the gas injection holes 46e.

A variable DC power supply 48b electrically connected to the shower head 46 serving as the upper electrode through a low pass filter (LPF) 48a. The variable DC power supply 48b can be on-off controlled by an on/off switch 48c. A current and a voltage of the variable DC power supply 48b and on/off operation of the on/off switch 48c are controlled by a controller 90 to be described later. As will be described later, when plasma is generated in the processing space by applying the RF power from the first RF power supply 40a and the RF power from the second RF power supply 40b to the substrate support 31, the on/off switch 48c is turned on by the controller 90 and a predetermined DC voltage is applied to the shower head 46 serving as the upper electrode, if necessary.

A cylindrical ground conductor 30a extends upward from a sidewall of the processing chamber 30 to a position higher than a height of the shower head 46. The cylindrical ground conductor 30a has a ceiling wall at the top thereof.

A gas exhaust port 81 is formed at the bottom portion of the processing chamber 30. A gas exhaust unit 83 is connected to the gas exhaust port 81 through a gas exhaust line 82. The gas exhaust unit 83 may include a vacuum pump. By operating the vacuum pump, a pressure in the processing chamber 30 can be decreased to a predetermined vacuum level.

A first gate 84 for loading and unloading the wafer W is provided at the sidewall of the processing chamber 30. A gate valve G for opening and closing the first gate 84 is provided at the first gate 84. The first gate 84 is connected to a vacuum transfer chamber through the gate valve G while maintaining airtightness and the wafer P can be loaded into and unloaded from the vacuum transfer chamber while maintaining the vacuum atmosphere.

A deposition shield 86 is provided along an inner wall surface of the processing chamber 30. The deposition shield prevents etching by-products (deposits) from being attached to the processing chamber 30. The deposition shield 86 is detachably provided.

The operation of the plasma etching apparatus 10 configured as described above is integrally controlled by the controller 90. The controller 90 is, e.g., a computer and controls the individual components of the plasma etching apparatus 10.

In the plasma etching apparatus 10, it is important to measure a state in the processing chamber 30 because the state in the processing chamber 30 affects the characteristics of the processed wafer W. Therefore, there is suggested a technique for measuring an emission intensity of plasma in the processing chamber 30 from the outside of the processing chamber using an optical emission spectrometer (OES) disposed on the sidewall of the processing chamber 30 through a quartz window.

However, in the case of measuring the state in the processing chamber 30 from the outside of the processing chamber 30 using the measuring device such as the OES, the measuring device is distant from the wafer W disposed in the processing chamber and, thus, the measurement accuracy near the substrate is diminished.

Therefore, in the plasma etching apparatus 10, it is considered to open the processing chamber to the atmosphere and dispose the measuring device such as an OES near the substrate to directly measure the state in the processing chamber. However, in the plasma etching apparatus 10, once the processing chamber 30 is opened to the atmosphere, a considerable amount of time is required to restart the substrate processing due to a control such as temperature adjustment or moisture control in the processing chamber 30. Thus, the productivity is lowered.

In view of the above, it is considered to measure the state in the processing chamber 30 without opening the processing chamber 30 to the atmosphere by providing the measuring device such as an OES at a transfer system such as a transfer arm for transferring the wafer W to the plasma etching apparatus 10 and transferring the measuring device into the processing chamber 30 using the transfer system. Since, however, the measuring device is heavier than the wafer W, the transfer system having a strength that can withstand the weight of the measuring device is required in the case of transferring the measuring device using the transfer system. Therefore, it is not practical to transfer the measuring device using the transfer system.

Therefore, the plasma etching apparatus 10 according to the embodiment further includes a gate for measuring the state in the processing chamber 30 in addition to the first gate 84 for loading and unloading the wafer W. For example, as shown in FIG. 1, the plasma etching apparatus 10 includes a second gate 95 on a side opposite to the side where the first gate 84 is disposed with respect to the substrate support 31 on which the wafer W is placed. The second gate 95 is airtightly closed by a lid 96. A measuring device 100 to be described later is detachably attached to the second gate 95. In the case of measuring the state in the processing chamber 30, an operator attaches the measuring device 100 to the plasma etching apparatus 10 that is a target apparatus to be measured by the measuring device 100.

(Configuration of the Measuring Device)

Figure 2:
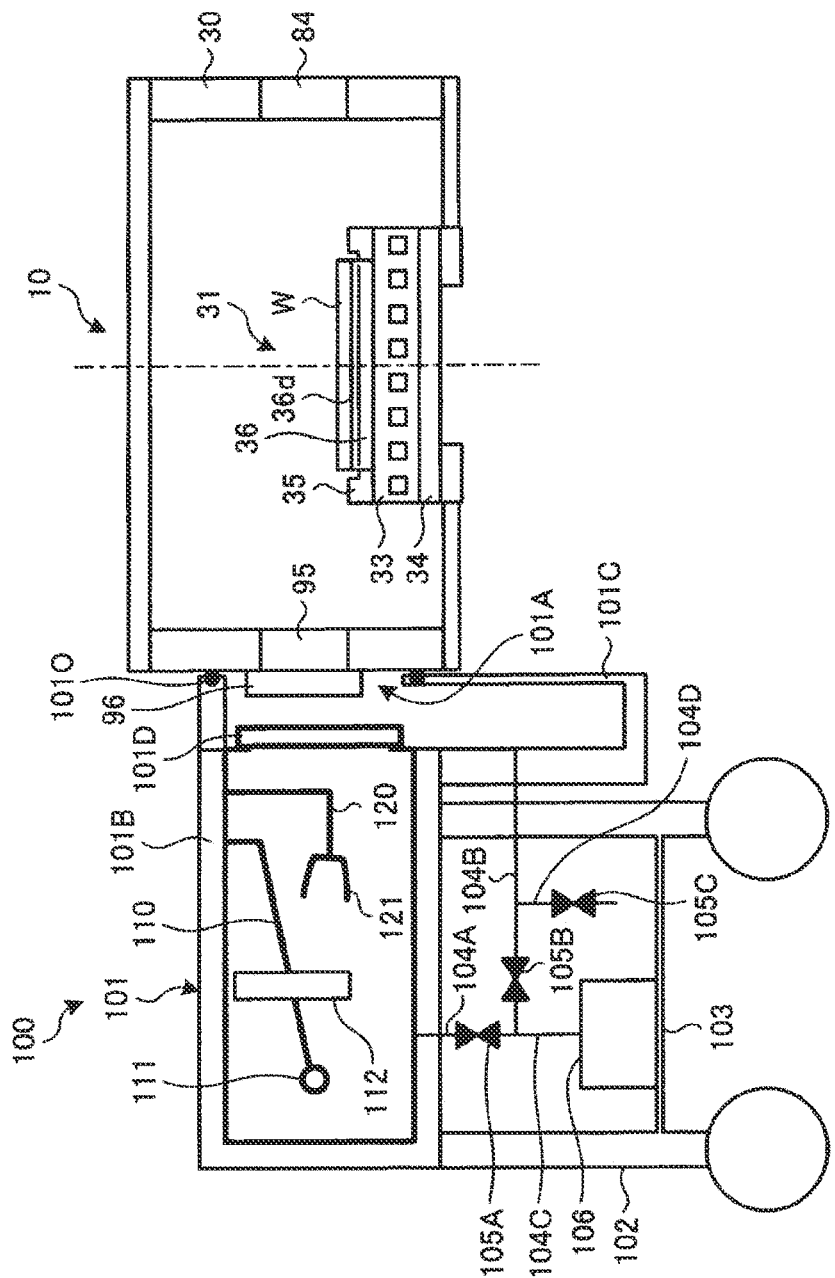
FIG. 2 is a cross-sectional view schematically showing a measuring device according to the embodiment.

Next, the configuration of the measuring device 100 according to the embodiment will be described. FIG. 2 is a cross-sectional view schematically showing the measuring device 100 according to the embodiment. FIG. 2 shows a state in which the measuring device 100 is attached to the plasma etching apparatus 10. In the following drawings, the plasma etching apparatus 10 is illustrated in a simplified manner.

The measuring device 100 includes a case 101 having an opening 101A that is sized to correspond to the second gate 95 of the plasma etching apparatus 10. An O-ring 101O is disposed at a portion around the opening 101A where the case 101 is in contact with the plasma etching apparatus 10. Further, the case 101 is mounted on a transfer vehicle 102. The measuring device 100 is transferred to the position of the plasma etching apparatus 10 by the transfer vehicle 102, and the opening 101A of the case 101 is positioned to correspond to the second gate 95. Then, the opening 101A of the case 101 is airtightly attached and fixed to the second gate 95 by means of screws, for example.

The case 101 includes a first case 101B and a second case 101C communicating with the first case 101B through an openable shutter member 101D. A measuring mechanism to be described later is accommodated in the first case 101B. The opening 101A is formed in the second case 101C.

A first pipe 104A provided with a first valve 105A is connected to the first case 101B. A second pipe 104B provided with a second valve 105B is connected to the second case 101C. The first pipe 104A and the second pipe 104B are connected to a vacuum pump 106 through a common pipe 104C. The vacuum pump 106 is placed on a loading platform 103 disposed in the transfer vehicle 102. The second pipe 104B is branched into a leakage pipe 104D between the second case 101C and the second valve 105B. The leakage pipe 104D is provided with a leakage valve 105C. The vacuum pump 106, the first pipe 104A, the second pipe 104B, and the common pipe 104C constitute a decompressing mechanism for reducing a pressure in the case 101. When the state in the processing chamber 30 is measured, the measuring device 100 operates the vacuum pump 106 to perform evacuation through the first pipe 104A, the second pipe 104B, and the common pipe 104C to reduce a pressure in the first case 101B and a pressure in the second case 101C.

The measuring mechanism configured to measure the state in the processing chamber 30 is disposed in the first case 101B. The measuring device 100 of the present embodiment includes, as the measuring mechanism, a robot arm 110 and a sensor 111 disposed at a tip end of the robot arm 110. The sensor 111 is configured to measure the state in the processing chamber 30.

The robot arm 110 includes an arm unit in which multiple arms are indirectly connected and a support unit for supporting the arm unit to be rotatable and vertically movable. The robot arm 110 is configured to be extensible and contractible by unfolding the arms of the arm unit in a straight line or folding the arms. The robot arm 110 can extend the multiple arms of the arm unit toward the opening 101A so that the tip end thereof can enter the processing chamber 30 through the opening 101A. The operation of the robot arm 110 is integrally controlled by a control unit (not shown). The control unit includes a user interface that receives various operation instructions or displays the operation status. An operator sends an operation instruction to the user interface. For example, the operation instruction individually specifies the movements of the robot arm 110. Alternatively, the operation instruction may specify a series of movements. For example, the operation instruction may specify a series of movements for measuring the state in the processing chamber 30 using the sensor 111.

Further, the robot arm 110 is detachably attached to the first case 101B. In other words, the robot arm 110 can be replaced by a different robot arm having a sensor different from the sensor 111 at the tip end thereof.

Further, the robot arm 110 has a lid 112 in the middle of the arm unit. When the lid 96 is removed from the second gate 95, the lid 112 airtightly closes the second gate 95, instead of the lid 96.

The sensor 111 is transferred by the robot arm 110 to a predetermined position in the processing chamber 30 through the opening 101A and measures the state in the processing chamber 30 at the predetermined position. For example, the sensor 111 is transferred to a position above the wafer hi placed on the substrate support 31 and measures the state in the processing chamber 30 at the position above the wafer W. The state in the processing chamber 30 that can be measured by the sensor 111 include, e.g., an electron density of plasma generated in the processing chamber 30, a frequency of the RF power applied for plasma generation, a mass of ions in the plasma, a pressure in the processing chamber 30, a temperature and a surface shape of the wafer W, and the like. Further, when the sensor 111 is transferred by the robot arm 110 to a position above the focus ring 35 around the wafer W, the sensor 111 may measure the consumption amount of the focus ring 3 or the position of the focus ring 35. The sensor 111 may integrally measure multiple different states, or may individually measure multiple states. The data indicating the state measured by the sensor 111 may be stored in a predetermined storage device in the measuring device 100, or may be transmitted to a communication device that can communicate with the measuring device 100 in a wired/wireless manner. The communication device may be, e.g., the plasma etching apparatus 10, or another plasma etching apparatus different from the plasma etching apparatus 10.

Further, the measuring device 100 includes a removing unit for removing the lid 96 from the second gate 95 of the plasma etching apparatus 10. For example, the measuring device 100 includes, as the removing unit, a robot arm 120 and a robot hand 121 provided at a tip end of the robot arm 120. The robot arm 120 has an arm unit in which multiple arms are indirectly connected and a support unit supporting the arm unit to be rotatable and vertically movable. The robot arm 120 can extend the multiple arms of the arm unit toward the lid 96, grip the lid 96 with the robot hand 121, and remove the lid 96 from the second gate 95. The movements of the robot arm 120 and the robot hand 121 are integrally controlled by a control unit (not shown). The control unit includes a user interface that receives various operation instructions and displays the operation status. An operator sends an operation instruction to the user interface. For example, the operation instruction individually specifies the movements of the robot arm 120 or the movements of the robot hand 121. Alternatively, the operation instruction may specify a series of movements. For example, the operation instruction may specify a series of movements for removing the lid 96 from the second gate 95.

Figure 3:
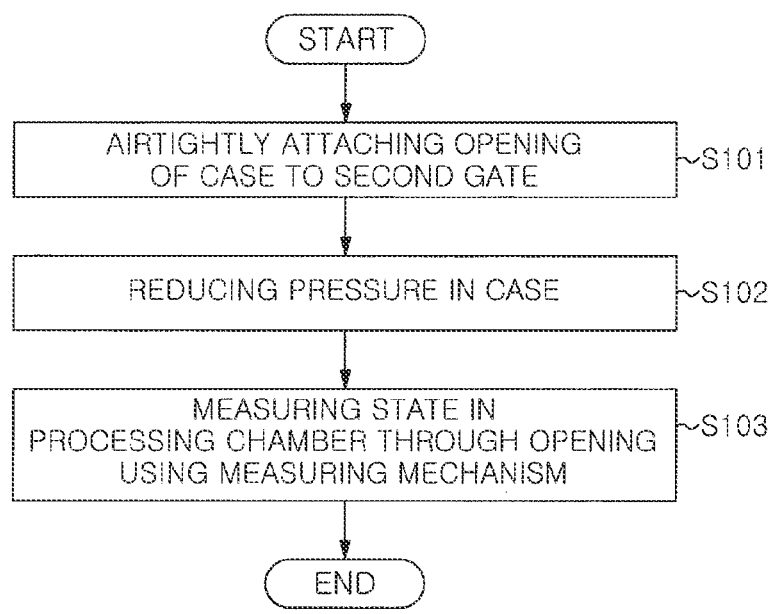
FIG. 3 is a flowchart showing an example of a sequence of measuring a state in a processing chamber using the measuring device according to the embodiment.

Next, an example of a measurement using the measuring device 100 will be described. FIG. 3 is a flowchart showing an example of a sequence of measuring the state in the processing chamber 30 using the measuring device 100 according to the embodiment.

First, the opening 101A of the case 101 is airtightly attached to the second gate 95 (step S101). Next, the measuring device 100 operates the vacuum pump 106 to reduce the pressure in the case 101 (step S102). Next, the measuring device 100 measures the state in the processing chamber 30 through the opening 101A using the measuring mechanism (the robot arm 110 and the sensor 111) in a state where the pressure in the case 101 as reduced (step S103).

Next, a specific example of the measurement using the measuring device 100 will be described. FIGS. 4 to 12 explain the specific example of the sequence of measuring the state in the processing chamber 30 using the measuring device 100 according to the embodiment.

Figure 4:
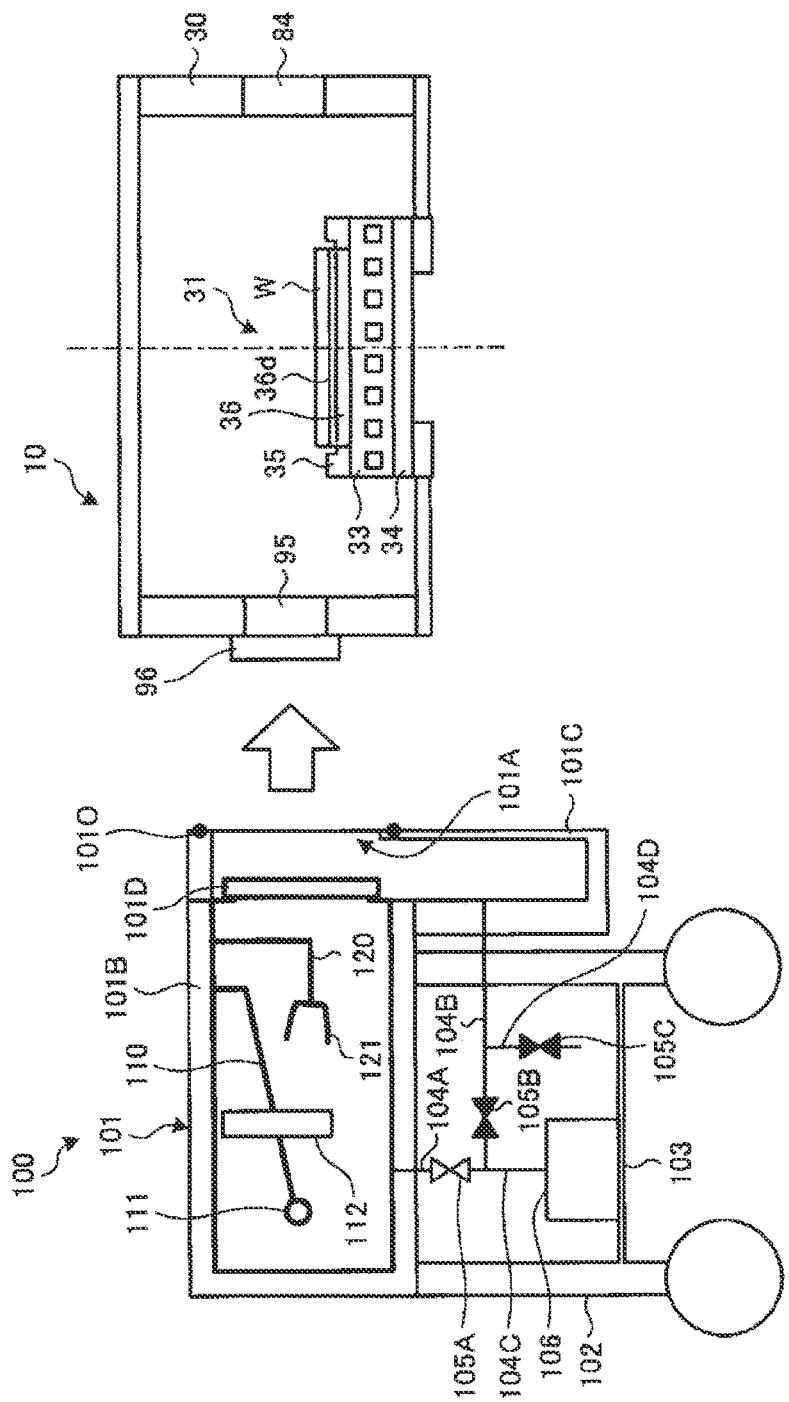
FIGS. 4 to 12 explain a specific example of the sequence of measuring the state in the processing chamber using the measuring device according to the embodiment.

When the state in the processing chamber 30 is measured, an operator moves the transfer vehicle 102 to transfer the measuring device 100 to the position of the plasma etching apparatus 10 as shown in FIG. 4. At this time, the first valve 105A is controlled to be open. Then, the vacuum pump 106 reduces the pressure in the first case 101B in a state where the shutter member 101D is closed.

Figure 5:
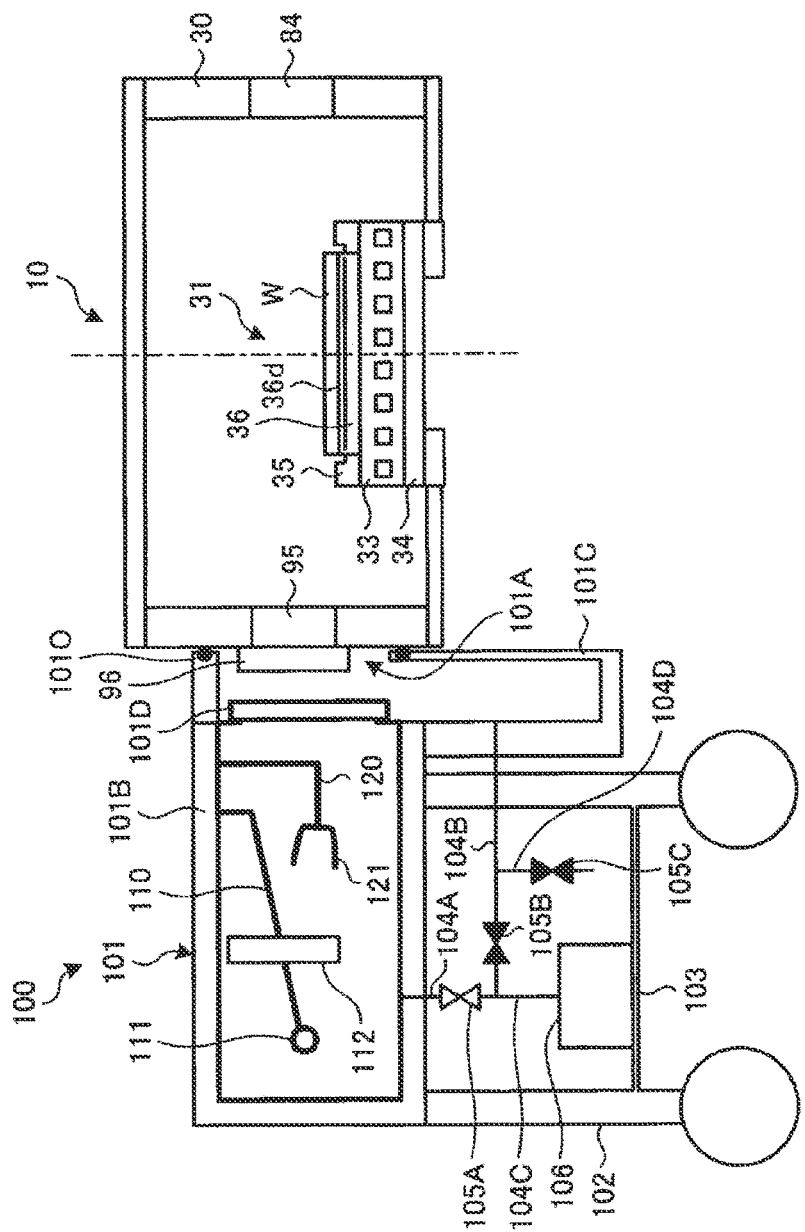

Next, as shown in FIG. 5, the opening 101A of the case 101 (the second case 101C) is airtightly attached to the second gate 95. The process of FIG. 5 corresponds to step S101 of FIG. 3.

Figure 6:
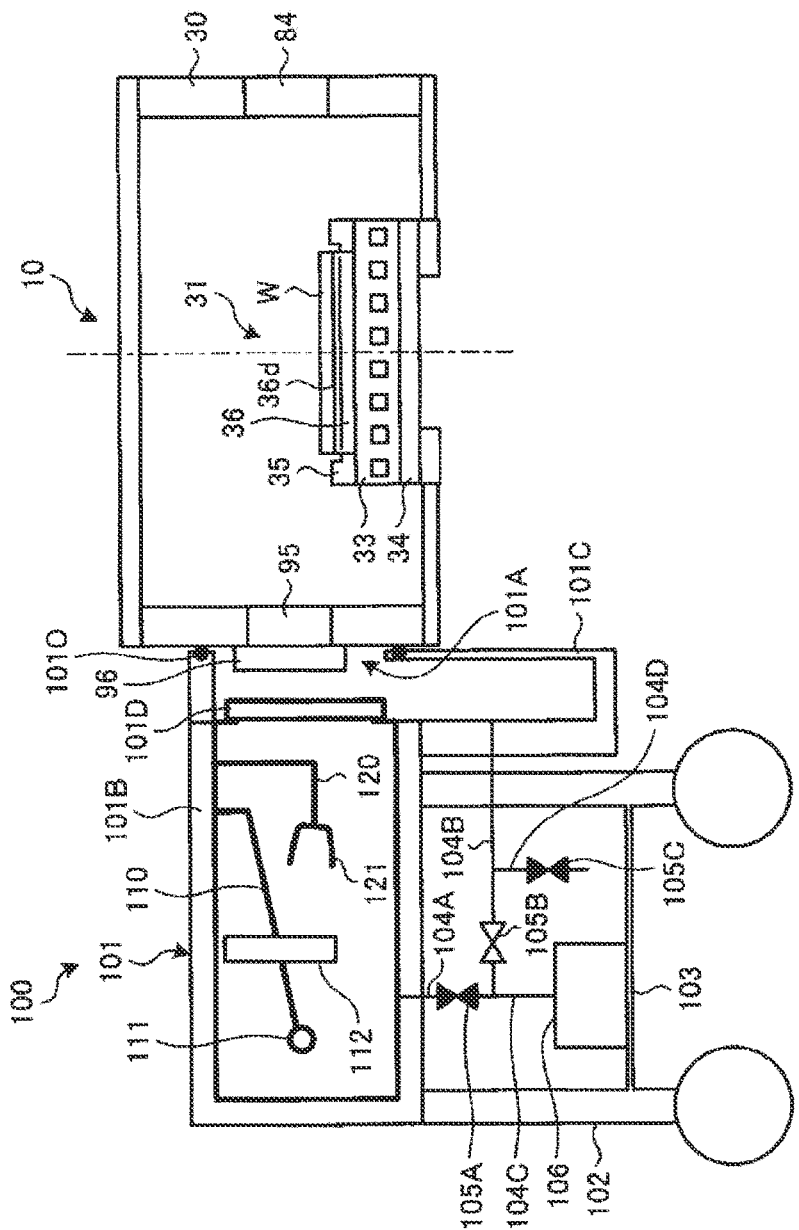

When the opening 101A of the case 101 (the second case 101C) is attached to the second gate 95, the first valve 105A is switched from the open state to the closed state, and the second valve 105B is controlled to be open as shown in FIG. 6. Then, the vacuum pump 106 reduces the pressure in the second case 101C. Accordingly, both of the pressure in the first case 101B and the pressure in the second case 101C, i.e., the pressure in the entire case 101 is reduced. The process of FIG. 6 corresponds to step S102 of FIG. 3.

Figure 7:
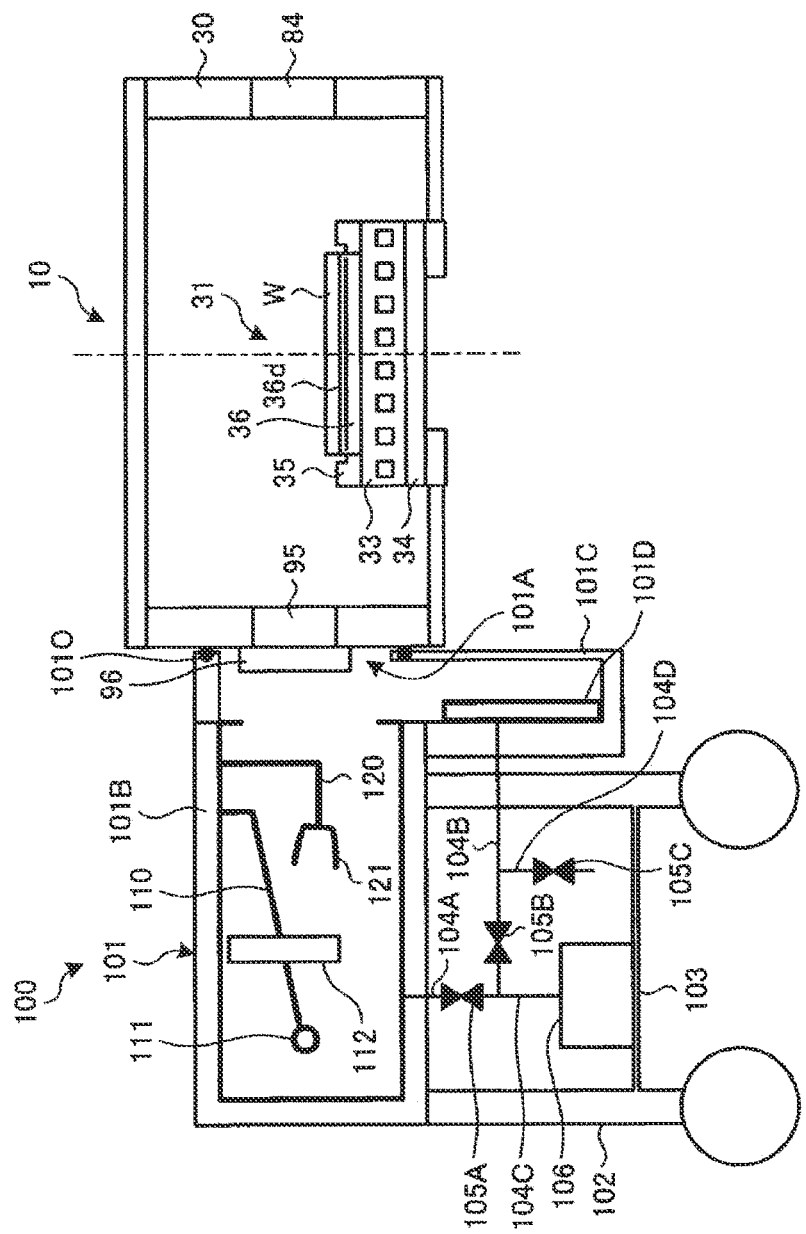

Next, as shown in FIG. 7, the shutter member 101D is open, and the first case 101B and the second case 101C communicate with each other. Then, the second valve 105B is switched from the open state to the closed state.

Figure 8:
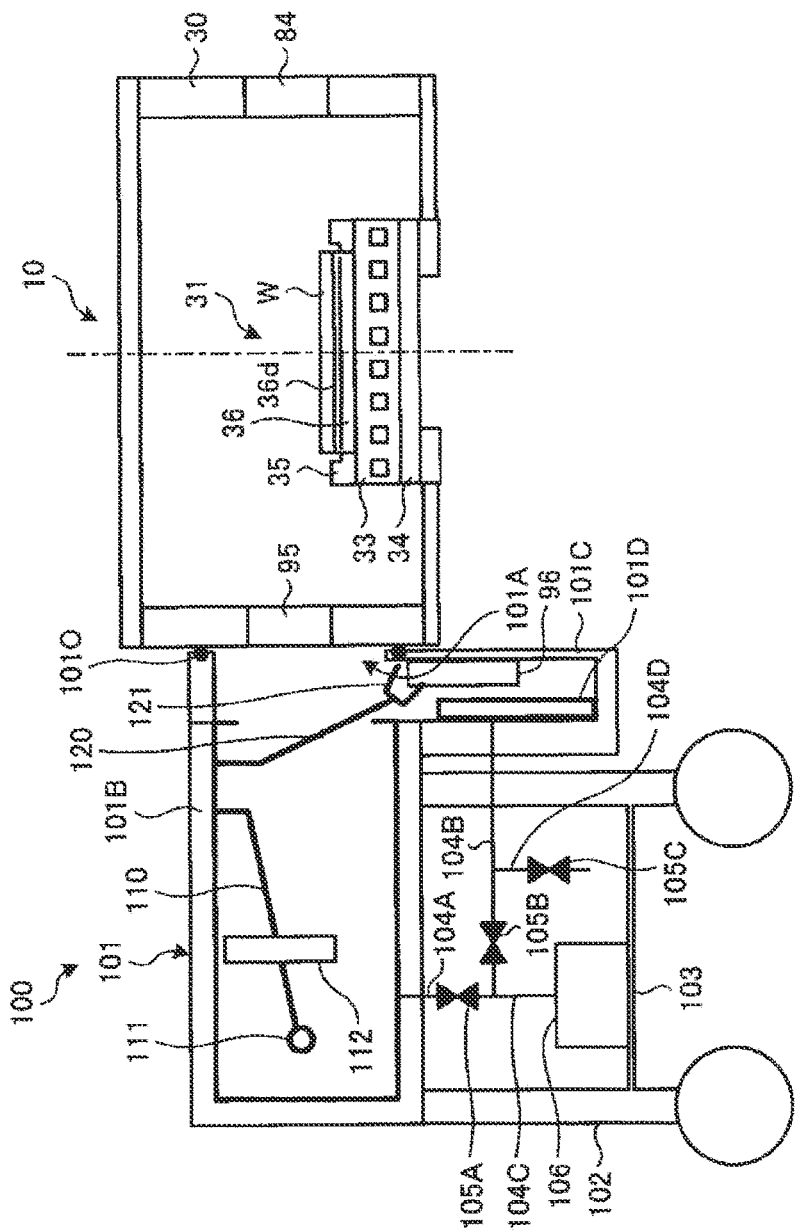

Next, as shown in FIG. 8, the robot arm 120 extends the multiple arms of the arm unit toward the lid 96, grips the lid 96 with the robot hand 121, and removes the lid 96 from the second gate 95. Accordingly, the second gate 95 is open, and the case 101 and the processing chamber 30 communicate with each other. Then, the robot arm 120 retracts the lid 96 to a predetermined retreat position in the second case 101C.

Figure 9:
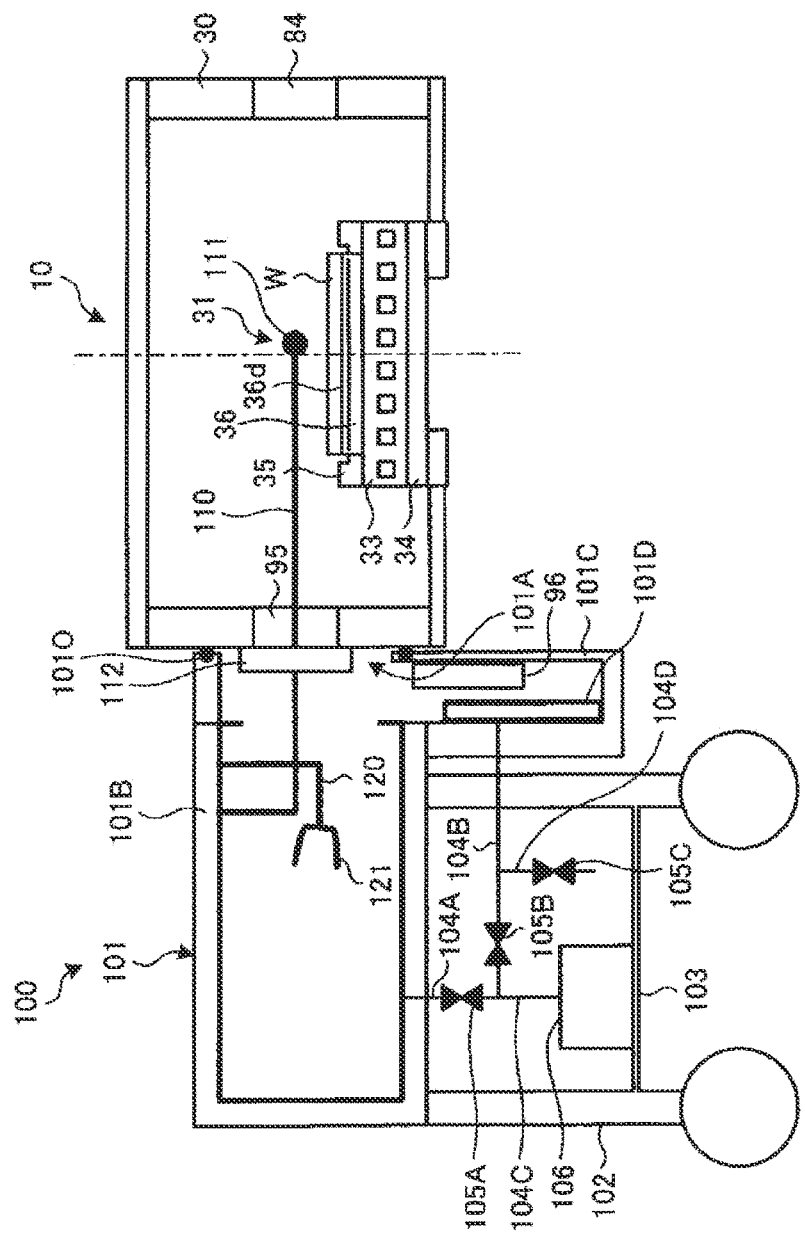

Next, as shown in FIG. 9, the robot arm 110 extends the multiple arms of the arm unit toward the opening 101A so that the tip end of the robot arm 110 where the sensor 111 is disposed enters the processing chamber 30 through the opening 101A. Therefore, the sensor 111 is transferred to a predetermined position in the processing chamber 30 through the opening 101A. Further, the robot arm 110 airtightly attaches the lid 112 provided at the arm unit to the second gate 95. Accordingly, the second gate 95 is airtightly closed by the lid 112. When the lid 112 is attached to the second gate 95, the plasma etching apparatus 10 generates plasma in the processing chamber 30. Then, the sensor 111 measures the state in the processing chamber 30 at the predetermined position in the processing chamber 30. For example, the sensor 111 measures the state in the processing chamber 30 at a position above the wafer W placed on the substrate support 31. Further, the robot arm 110 may sequentially move the tip end provided with the sensor 111 to multiple positions in the processing chamber 30. Accordingly, the sensor 111 is sequentially transferred to the multiple positions in the processing chamber 30. Then, the sensor 111 measures the state in the processing chamber 30 at each of the positions. For example, the sensor 111 measures the state in the processing chamber 30 at a position above the central portion of the wafer W placed on the substrate support 31, and then measures the state in the processing chamber 30 at a position above the edge portion of the wafer W. The process of FIG. 9 corresponds to seep S103 of FIG. 3.

Figure 10:
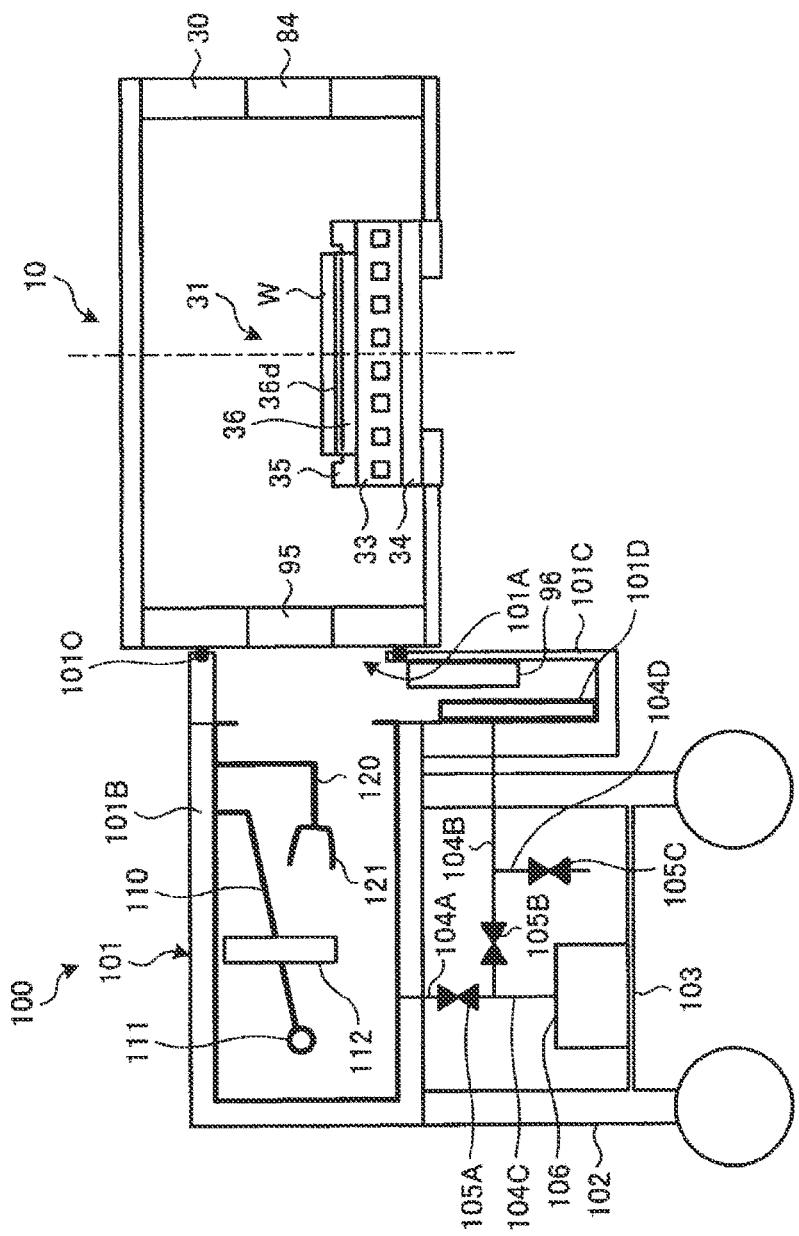

When the measurement of the sensor 111 is completed, the plasma etching apparatus 10 stops the generation of plasma in the processing chamber 30. When the generation of plasma in the processing chamber 30 is stopped, the robot arm 110 contracts the multiple arms of the arm unit so that the tip end provided with the sensor 111 retracts into the case 101 (the first case 101B) as shown in FIG. 10. At this time, the robot arm 110 removes the lid 112 from the second gate 95.

Figure 11:
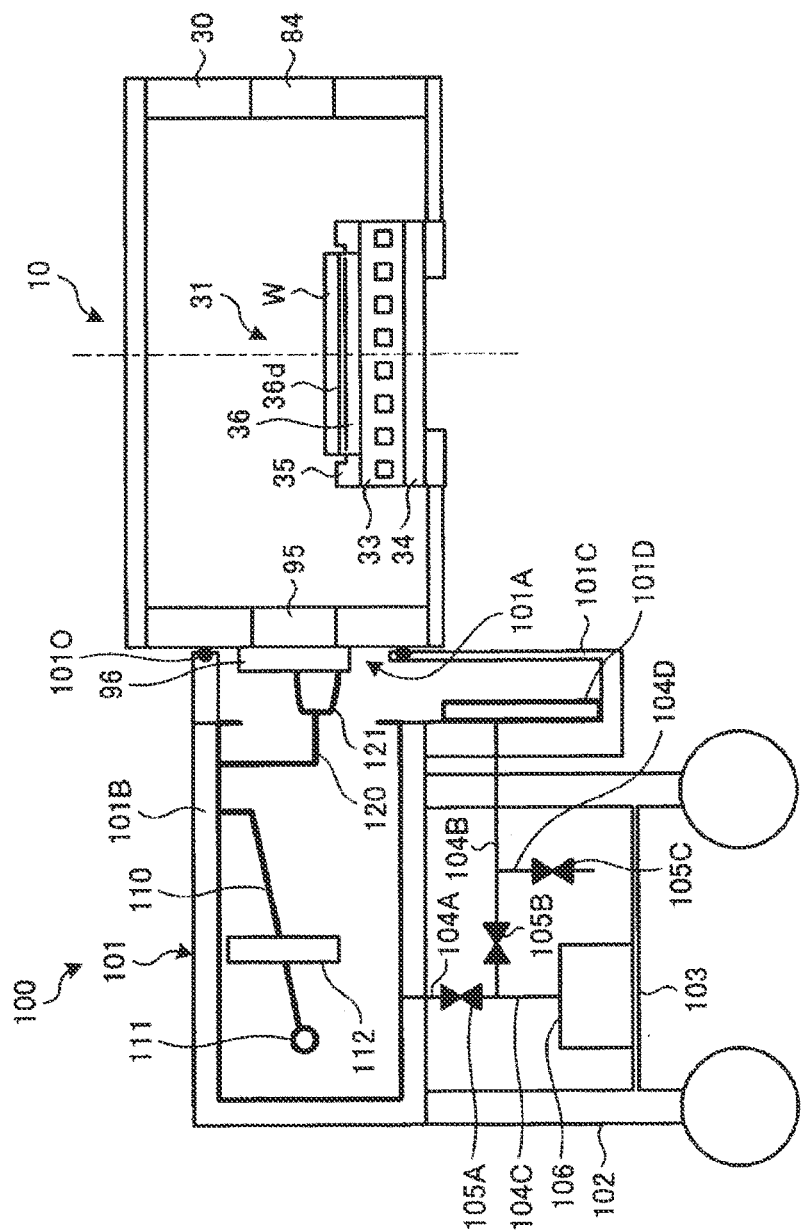

Next, as shown in FIG. 11, the robot arm 120 extends the multiple arms of the arm unit toward the predetermined retreat position in the second case 101C, grips the lid 96 with the robot hand 121, and attaches the lid 96 to the Gate 95. Accordingly, the second gate 95 is airtightly closed by the lid 96.

Figure 12:
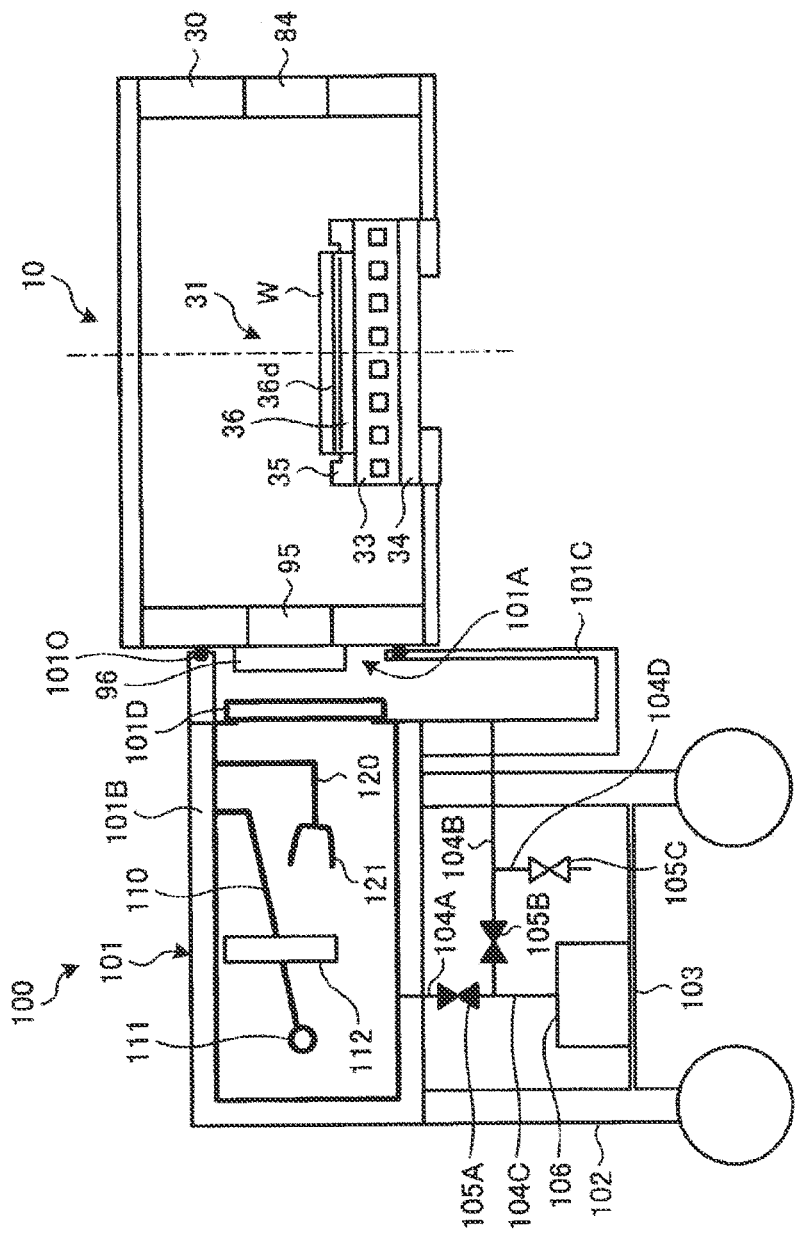

Next, as shown in FIG. 12, the second case 101C is opened to the atmosphere by opening the leakage valve 105C in a state where the shutter member 101D is closed. After the state in the processing chamber 30 is measured in the above-described order, the operator moves the transfer vehicle 102 to separate the measuring device 100 from the plasma etching apparatus 10.

As described above, the measuring device 100 of the present embodiment includes the case 101 that is airtightly attached to the second gate 95 and has the opening 101A that is sized to correspond to the second gate 95 of the plasma etching apparatus 10. The measuring device 100 further includes the decompressing mechanism for reducing a pressure in the case 101. The measuring device 100 further includes the measuring mechanism that is accommodated in the case 101 to measure the state in the processing chamber 30 through the opening 101A in a state where the pressure in the case 101 is reduced by the decompressing mechanism. Accordingly, the measuring device 100 can measure the state in the processing chamber 30 with high accuracy without opening the processing chamber 30 to the atmosphere. Further, since the measuring device 100 measures the state in the processing chamber 30 without using the transfer system for transferring the wafer W, the transfer of the measuring device by using the transfer system can be omitted. As a result, the strength required for the transfer system can be reduced.

Further, the measuring mechanism of the measuring device 100 of the present embodiment further includes the robot arm 110 whose tip end can enter the processing chamber 30 through the opening 101A and the sensor 111 disposed at the tip end of the robot arm 110 to measure a state in the processing chamber 30. Accordingly, the measuring device 100 can directly measure the state in the processing chamber 30 at any position in the processing chamber 30 without exposing the processing chamber 30 to the atmosphere.

Further, the robot arm 110 of the present embodiment is detachably attached to the case 101 (the first case 101B). Thus, the measuring device 100 can easily replace the robot arm 110 with a different robot arm having another sensor. Accordingly, various states in the processing chamber 30 can be measured using various sensors.

When the opening 101A of the second case 101C is not attached to the second gate 95, the decompressing mechanism of the measuring device 100 of the present embodiment reduces the pressure in the first case 101B in a state where the shutter member 101D is closed. When the opening 101A of the second case 101C is attached to the second gate 95, the decompressing mechanism reduces the pressure in the second case 101C. In a state where the pressure in the first case 101B and the pressure in the second case 101C are reduced, after the shutter member 101D and the second gate 95 are open, the robot arm 110 moves the tip end thereof provided with the sensor 111 into the processing chamber 30 through the opening 101A. Therefore, the measuring device 100 can use the second case 101C as a vacuum preliminary chamber. Accordingly, it is possible to prevent particles or moisture in the atmosphere from entering the first case 101B or the processing chamber 30.

Further, the plasma etching apparatus 10 of the present embodiment further includes the processing chamber 30 having the first gate 84 for loading and unloading the wafer W and the second gate 95 to which the measuring device 100 configured to measure the state in the processing chamber 30 is detachably attached. Accordingly, the plasma etching apparatus 10 can measure the state in the processing chamber 30 with high accuracy without opening the processing chamber 30 to the atmosphere. Since the plasma etching apparatus 10 measures the state in the processing chamber 30 without using the transfer system for transferring the wafer W, the transfer of the measuring device by using the transfer system can omitted. Hence, the strength required for the transfer system can be reduced.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above-described embodiment, the case where the measuring device 100 is used for measuring the state in the processing chamber 30 of the plasma etching apparatus 10 has been described as an example. However, the present disclosure is not limited thereto. The measurement target device to be measured by the measuring device 100 may be any apparatus as long as it includes a processing chamber in a vacuum state.

Further, in the above-described embodiment, the case where the second gate 95 of the plasma etching apparatus 10 is closed by the lid 96 while maintaining airtightness has been described as an example. However, the present disclosure is not limited thereto. For example, a gate valve G may be disposed at the second gate 95 of the plasma etching apparatus 10 to open and close the second gate 95. In this case, the measuring device 100 does not require the removing unit (e.g., the robot arm 120 and the robot hand 121) for removing the lid 96 from the second gate 95.

Further, in the above-described embodiment, the case where the state in the processing chamber 30 is measured using the sensor 111 disposed at the tip end of the robot arm 110 has been described as an example. However, the present disclosure is not limited thereto. For example, the measuring device 100 may directly measure the state in the processing chamber 30 using a sensing wafer that is placed on the substrate support 31 by the robot arm and has the same sensing function as that of the sensor 111.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equiva-

The invention claimed is:

1. A measuring device for measuring a state in a processing chamber of a vacuum processing apparatus, the measuring device being detachably attached to the processing chamber, the measuring device comprising:
 a measuring mechanism configured to measure a state in the processing chamber;
 a first case in which the measuring mechanism is accommodated;
 a second case communicating with the first case through an openable shutter member, having an opening for connecting with a gate of the processing chamber, and being located between the first case and the processing chamber; and
 a decompressing mechanism configured to reduce pressure in the first case and pressure in the second case.

2. The measuring device of claim 1, wherein the measuring mechanism includes:
 a first arm having a tip end that is movable into the processing chamber through the opening; and
 a sensor disposed at the tip end of the first arm and configured to measure the state in the processing chamber.

3. The measuring device of claim 2, wherein the first arm is detachably attached to the first case.

4. The measuring device of claim 2, wherein
 the first arm is configured to move the tip end provided with the sensor into the processing chamber through the opening after the shutter member and the gate are open when pressure in the first case and pressure in the second case are reduced.

5. The measuring device of claim 3, wherein
 the first arm is configured to move the tip end provided with the sensor into the processing chamber through the opening after the shutter and the gate are open when pressure in the first case and pressure in the second case are reduced.

6. The measuring device of claim 1, wherein when the opening of the second case is not attached to the processing chamber, the decompressing mechanism reduces pressure in the first case when the shutter member is closed, and when the opening of the second case is attached to the processing chamber, the decompressing mechanism reduces pressure in the second case.

7. The measuring device of claim 1, comprising:
 a first pipe connecting the decompressing mechanism with the first case;
 a second pipe connecting the decompressing mechanism with the second case;
 a first valve provided on the first pipe; and
 a second valve provided on the second pipe.

8. The measuring device of claim 7, comprising:
 a third pipe branched from the second pipe between the second valve and the second case and communicating with the atmosphere; and
 a third valve provided on the third pipe and opening the second case to the atmosphere.

9. The measuring device of claim 1, further comprising:
 a removing unit configured to remove a lid for closing the gate of the processing chamber from the gate.

10. The measuring device of claim 9, wherein the removing unit includes:
 a second arm provided in the first case; and
 a robot hand provided at a tip end of the second arm.

* * * * *